United States Patent

Lee

[11] Patent Number: 5,834,795
[45] Date of Patent: Nov. 10, 1998

[54] TEST PATTERN FOR MEASURING LINE WIDTH OF ELECTRODE AND METHOD FOR MEASURING THE SAME

[75] Inventor: Hyok Jae Lee, Chungcheongbuk-do, Rep. of Korea

[73] Assignee: LG Semicon Co., Ltd., Chungcheongbuk-Do, Rep. of Korea

[21] Appl. No.: 778,276

[22] Filed: Jan. 2, 1997

[30] Foreign Application Priority Data

Jul. 19, 1996 [KR] Rep. of Korea .................. 29217/1996

[51] Int. Cl.$^6$ .................................................. H01L 23/58
[52] U.S. Cl. ............................................................ 257/48
[58] Field of Search ............................ 257/48; 324/693, 324/716, 765

[56] References Cited

U.S. PATENT DOCUMENTS

| | | | |
|---|---|---|---|
| 3,974,443 | 8/1976 | Thomas | 324/716 |
| 4,347,479 | 8/1982 | Cullet | 324/716 |
| 4,516,071 | 5/1985 | Buehler | 324/765 |
| 4,978,923 | 12/1990 | Maltiel | 324/693 |
| 5,477,062 | 12/1995 | Natsume | 257/48 |

*Primary Examiner*—Tom Thomas
*Assistant Examiner*—Cuong Quang Nguyen
*Attorney, Agent, or Firm*—Morgan, Lewis & Bockius LLP

[57] ABSTRACT

A test pattern for measuring a line width of an electrode includes a substrate; an electrode having a predetermined line width and length formed on the substrate; and, a plurality of lines extended from both ends of the electrode, whereby, first, a line width of a gate electrode in a transistor is measured accurately; second, a change in electrical characteristics of a transistor with respect to the change of the line width of a gate electrode during a fabrication process can be accurately revealed; third, comparison of changes in the line widths of a gate electrode during fabrication measured through an SEM and after completion of fabrication can be done easily; and fourth, a reliability of a completed device is easily assessable.

9 Claims, 3 Drawing Sheets

TEST PATTERN FOR MEASURING LINE WIDTH OF ELECTRODE AND METHOD FOR MEASURING THE SAME

BACKGROUND OF THE INVENTION

1. Field of the Invention

The present invention relates to an electrode in a semiconductor device, and more particularly, to a test pattern for measuring a line width of an electrode.

2. Discussion of The Related Art

A conventional test pattern for measuring a line width of an electrode is explained with reference to FIG. 1.

FIG. 1 illustrates a plan view of a conventional electrode pattern.

As shown in FIG. 1, the conventional electrode pattern consists of a gate electrode 2 formed in one direction on an active region 1 of a semiconductor substrate, source and drain regions 3 formed in surfaces of the substrate at both sides of the gate electrode 2, a bulk region 4 formed outside of the active region 1, and a plurality of contacts 5 formed in the source and drain regions 3 and the bulk region 4.

The foregoing semiconductor device is a transistor which operates when voltages are applied to the gate electrode 2, and the source and drain regions 3. The gate electrode 2 acts as a switch which turns the transistor on and off.

The performance of the transistor can be deteriorated dramatically by even a minute deviation from a desired line width of the gate electrode. For example, a 10% deviation of the line width of the gate electrode 2 may change the electrical characteristics of the transistor by more than 10%. Therefore, the line width of the gate electrode 2 has to be measured accurately in order to obtain an optimum device. Generally, an SEM (Scanning Electron Microscope) has been used during a fabrication process to measure the line width of the gate electrode 2.

However, the aforementioned conventional test pattern for measuring a line width of an electrode and the measuring method have the following problems.

First, it is impossible to measure accurately the line width of the gate electrode using an SEM. Reoxidation of the gate and oxidation of polysilicon caused by formation of sidewall on the gate results in a variation in the line width of the gate electrode from a desired or target width. Therefore, it is impossible to verify a correlation between a change in the line width of the gate electrode and a change in the electrical characteristics of the transistor.

Second, the line width of a gate electrode measured by means of an SEM is not directly applicable to a transistor. Since wafers pass through the different fabrication steps, the line width of the gates may differ in each step. Accordingly, the line widths measured by an SEM is limited and not suitable for obtaining an optimum line width of the gate electrode.

SUMMARY OF THE INVENTION

Accordingly, the present invention is directed to a test pattern for measuring a line width of an electrode that substantially obviates one or more of the problems due to limitations and disadvantages of the related art.

An object of the present invention is to provide a test pattern for accurately measuring a line width of an electrode.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a test pattern for measuring a line width of an electrode includes a substrate, an electrode having a predetermined line width and length formed on the substrate, and a plurality of lines extended from both ends of the electrode. The line width of the electrode may be different from a line width of each of the lines. That is, the line width of the electrode may be narrower than the line width of each of the lines.

In another aspect of the present invention, a test pattern for measuring a line width of an electrode comprises a substrate; an electrode having a first line width and length on the substrate; and a plurality of lines having a second line width extending from end portions of the electrode.

In another aspect of the present invention, a test pattern for measuring a line width of an electrode comprises a substrate having an active region; a gate electrode having a first line width and across the active region; source and drain regions in the active region at sides of the gate electrode; and a plurality of lines having a second width extending from end portions of the gate electrode.

In another aspect of the present invention, a test pattern for measuring a line width of an electrode comprises a substrate having an active region; a gate electrode having a first line width over and across the active region; source and drain regions in the active region at sides of the gate electrode; a plurality of lines having a second line width extending from each end portion of the gate electrode; and a plurality of pads each connected to a corresponding one of the plurality of lines.

In another aspect of the present invention, a method for measuring a line width of a test pattern for measuring a line width of a gate electrode having a plurality of lines at end portions thereof and a plurality of pads connected to corresponding ones of the plurality of lines, comprises the steps of applying a current between a first pad and a fourth pad; measuring a potential difference between a second pad and a third pad; measuring a sheet resistance based on the current and the potential difference; and determining the line width of the gate electrode based on the sheet resistance, the current, and the potential difference.

In a further aspect of the present invention, a method for measuring a line width of a test pattern for measuring a line width of a gate electrode having a plurality of lines at end portions thereof and a plurality of pads connected to corresponding ones of the plurality of lines, comprises the steps of distinguishing the line width of the gate electrode from a line width of the plurality of lines extending from the end portions of the gate electrode; applying a current between first and fourth pads of the plurality of pads; measuring a potential difference between second and third pads of the plurality of pads; measuring a sheet resistance using a Van Der Pauw method based on the current and the potential difference; and determining the line width of the gate electrode based on the sheet resistance, the current, and the potential difference.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
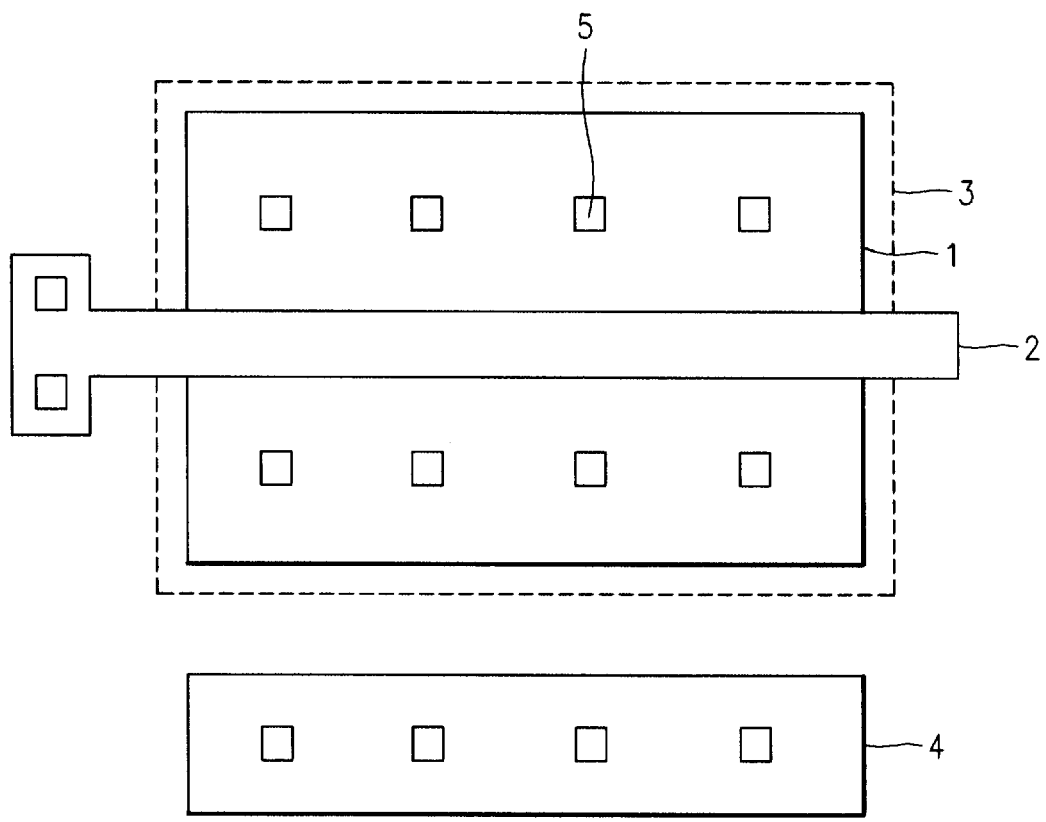
FIG. 1 illustrates a plan view of a conventional electrode pattern.
Figure 2:
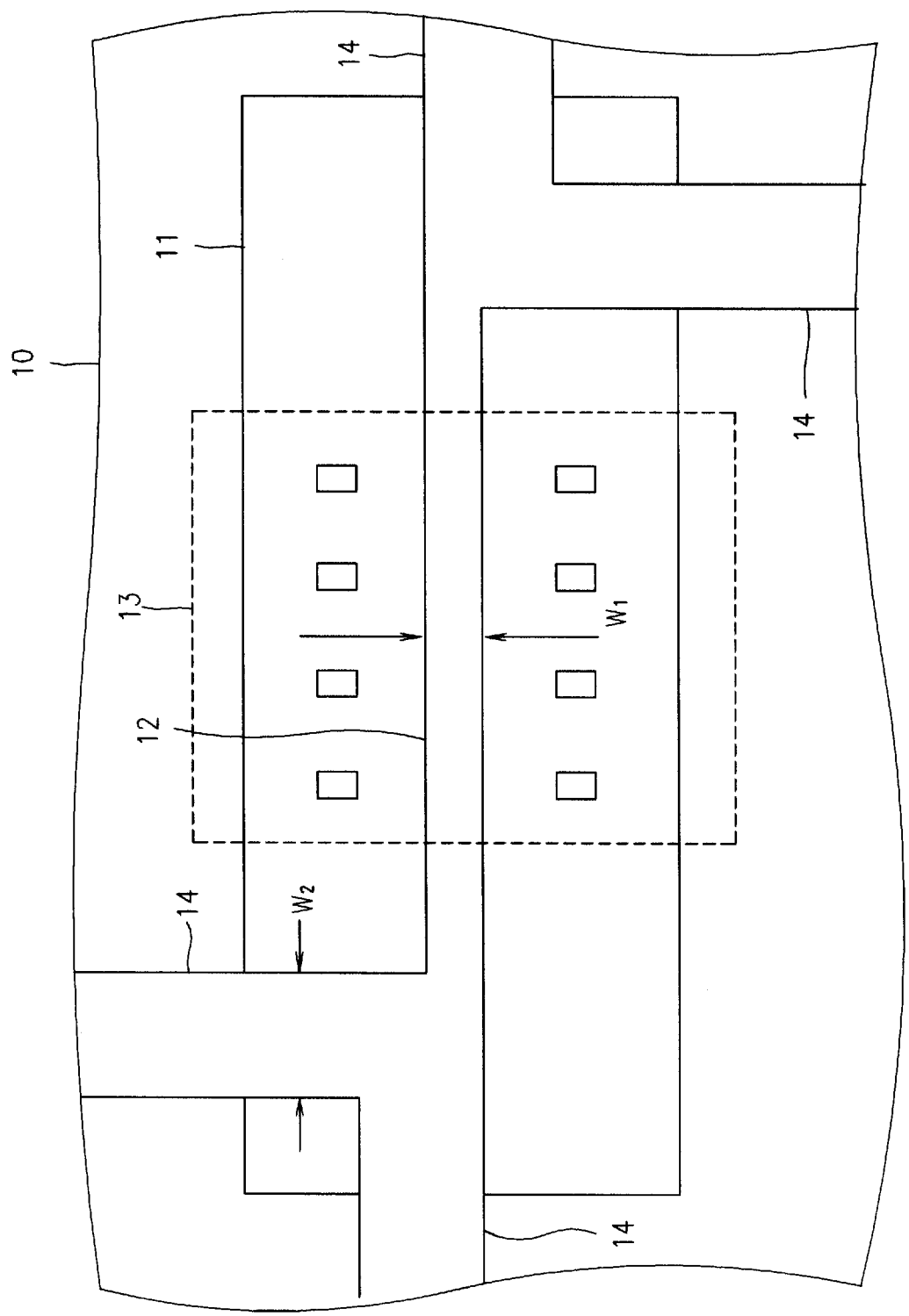
FIG. 2 illustrates a plan view of an electrode pattern in accordance with a first embodiment of the present invention.

FIG. 2 illustrates a plan view of an electrode pattern in accordance with a first embodiment of the present invention.

Referring to FIG. 2, the electrode pattern in accordance with the first embodiment of the present invention includes a substrate 10 having an active region 11 thereof, a gate electrode 12 formed over and across the active region 11, source and drain regions 13 formed in surfaces of the active region 11 at both sides of the gate electrode 12, and a plurality of lines 14 extending from both ends of the gate electrode 12. The line width of the electrode 12 may be different from a line width of each of the lines 14. Specifically, the line width of the electrode 12 may be narrower than the line width of each of the lines 14. The source and drain regions 13 are formed such that they do not contact the lines 14. After distinguishing the line width W1 of the gate electrode 12 from the line width W2 of each of the lines 14 using an SEM, for example, the line width W1 of the gate electrode 12 in the source and drain regions 13 is measured accurately.

Figure 3:
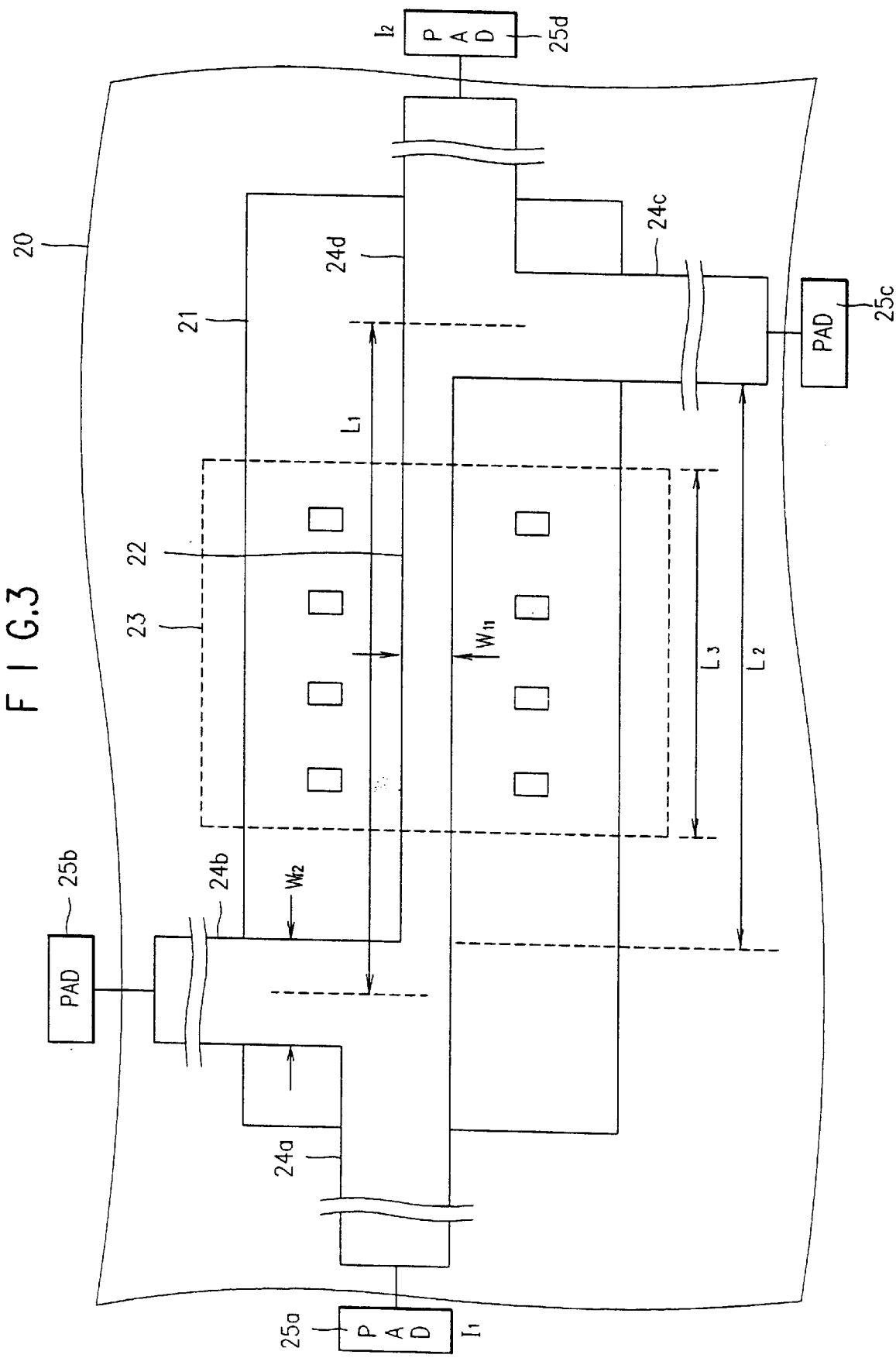
FIG. 3 illustrates a plan view of an electrode pattern in accordance with a second embodiment of the present invention.

FIG. 3 illustrates a plan view of an electrode pattern in accordance with a second embodiment of the present invention.

The electrode pattern in accordance with the second embodiment includes a substrate 20 having an active region 21 thereof, a gate electrode 22 formed over and across the active region 21, and source and drain regions 23 formed in surfaces of the active region 21 at both sides of the gate electrode 22. A first line 24a, a second line 24b, a third line 24c, and a fourth line 24d are positioned in pairs at both ends of the gate electrode 22. A first pad 25a, a second pad 25b, a third pad 25c, and a fourth pad 25d are each connected to one of the four lines. A line width W11 of the gate electrode 22 is different from a line width W12 of each of the first, second, third, and fourth lines. Specifically, the line width W11 of the gate electrode 22 is narrower than the line width W12 of each of the four lines. The source and drain regions 23 are formed such that they do not contact the four lines. After distinguishing the line width W11 of the gate electrode 22 from the line width W12 of each of the four lines using an SEM, for example, the line width W11 of the gate electrode 22, which is in the source and drain regions 23, is measured accurately.

A method for measuring a line width W11 of a test pattern for measuring a line width of an electrode in accordance with the present invention having the aforementioned system is explained below.

After applying a current between the first pad 25a and the fourth pad 25d, a potential difference between the second pad 25b and the third pad 25c is measured. Then, a sheet resistance is obtained using the Van der Pauw method. The sheet resistance $o_s$ can be expressed as follows:

$$\rho s = \frac{\pi}{\ln 2} \quad \frac{V}{I} = \frac{W}{L} \quad \frac{V_{12}}{I_{12}}$$

Using the sheet resistance value obtained, the line width W11 of the gate electrode 22 can be obtained. Thus, the line width W of the gate electrode 22 can be expressed as follows:

$$W = \rho s L \frac{I_{12}}{V_{12}}$$

where, $V_{12}$ is a potential difference $V_1-V_2$ of voltages $V_1$ and $V_2$, each measured in the second pad 25b and the third pad 25c, respectively. $I_{12}$ is a current flow between the first pad 25a and the fourth pad 25d. L is a length L1 of the gate electrode 22 between a middle of the line width W12 of the second line 24b connected to the second pad 25b and a middle of the line width W12 of the third line 24c connected to the third pad 25c.

Accordingly, using the first, second, third and fourth pads 25a, 25b, 25c and 25d connected to the four lines 24a, 24b, 24c and 24d, respectively extended from both ends of the gate electrode 22 and measuring currents and voltages, the line width W11 of the gate electrode 22 can be measured accurately.

In addition, a length L2 of the gate electrode 22 between the second line 24b connected to the second pad 25b and the third line 24c connected to the third pad 25c is longer than a length L3 of the source and drain regions 23. Accordingly, the line width W11 of the gate electrode 22 within the source and drain regions 23 can be measured accurately. If the length L3 of the source and drain regions 23 is longer or the same as the length L2 of the gate electrode 22, it is impossible to distinguish the line width W11 of the gate electrode 22 from the line widths W12 of the first, second, third and fourth lines 24a, 24b, 24c, and 24d connected to the first, second, third and fourth pads 25a, 25b, 25c and 25d, respectively. This poses a problem in measuring the line width using an SEM. Therefore, the line width W11 of the gate electrode in the source and drain regions 23 has to be narrower than each of the line widths W12 of the lines 24 connected to the first, second, third and fourth pads 25a, 25b, 25c and 25d.

As explained, the test pattern for measuring a line width of an electrode in accordance with the present invention has the following advantages.

First, a line width of a gate electrode in a transistor can be measured accurately. Second, a change in an electrical characteristic of a transistor with respect to a variation in the line width of a gate electrode during a fabrication process can be accurately revealed. Third, a comparison of a change in the line widths of a gate electrode during fabrication measured by an SEM and after the completion of fabrication can be done easily. Fourth, the reliability of the fabricated device is easily assessable.

It will be apparent to those skilled in the art that various modifications and variations can be made in method for fabricating semiconductor device of the present invention without departing from the spirit or scope of the invention. Thus, it is intended that the present invention cover the modifications and variations of this invention provided they come within the scope of the appended claims and their equivalents.

What is claimed is:

1. A test pattern for measuring a line width of an electrode comprising:

a substrate having an active region;

a gate electrode having a first line width and across the active region;

source and drain regions in the active region at sides of the gate electrode; and a plurality of lines having a second width extending from end portions of the gate electrode.

2. A test pattern for measuring a line width of an electrode according to claim 1, wherein the first line width of the electrode is different from the second line width of the plurality of lines extending from the end portions of the gate electrode.

3. A test pattern for measuring a line width of an electrode according to claim 1, wherein the first line width of the gate electrode is narrower than the second line width of the plurality of lines extending from end portions of the gate electrode.

4. A test pattern for measuring a line width of an electrode according to claim 1, wherein the source and drain regions do not contact the plurality of lines extending from the end portions of the gate electrode.

5. A test pattern for measuring a line width of an electrode comprising:

a substrate having an active region;

a gate electrode having a first line width over and across the active region;

source and drain regions in the active region at sides of the gate electrode;

a plurality of lines having a second line width extending from each end portion of the gate electrode; and a plurality of pads each connected to a corresponding one of the plurality of lines.

6. A test pattern for measuring a line width of an electrode according to claim 5, wherein the first line width of the gate electrode is different from the second line width of the plurality of lines.

7. A test pattern for measuring a line width of an electrode according to claim 5, wherein the first line width of the gate electrode is narrower than the second line width of the plurality of lines.

8. A test pattern for measuring a line width of an electrode according to claim 5, wherein the source and drain regions do not contact the plurality of lines.

9. A test pattern for measuring a line width of an electrode according to claim 5, wherein the plurality of lines includes four lines and the plurality of pads includes four pads.

* * * * *